(12) United States Patent
Park

(10) Patent No.: US 9,997,735 B2
(45) Date of Patent: Jun. 12, 2018

(54) ORGANIC LIGHT EMITTING DISPLAY APPARATUS WITH A PLURALITY OF LIGHT EMITTING DEVICES FOR EMITTING LIGHT OF DIFFERENCE COLORS

(71) Applicant: LG DISPLAY CO., LTD., Seoul (KR)

(72) Inventor: JinHo Park, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days. days.

(21) Appl. No.: 15/161,841

(22) Filed: May 23, 2016

(65) Prior Publication Data

US 2017/0141345 A1 May 18, 2017

(30) Foreign Application Priority Data

Nov. 17, 2015 (KR) .................. 10-2015-0161112

(51) Int. Cl.
| | | |
|---|---|---|
| *H01L 51/52* | (2006.01) | |
| *H01L 27/32* | (2006.01) | |
| *H01L 27/12* | (2006.01) | |
| *H01L 51/50* | (2006.01) | |

(52) U.S. Cl.
CPC ...... *H01L 51/5221* (2013.01); *H01L 27/3211* (2013.01); *H01L 27/3246* (2013.01); *H01L 27/3248* (2013.01); *H01L 27/3258* (2013.01); *H01L 27/3262* (2013.01); *H01L 51/5265* (2013.01); *H01L 27/1248* (2013.01); *H01L 27/3244* (2013.01); *H01L 51/5056* (2013.01); *H01L 2251/558* (2013.01)

(58) Field of Classification Search
CPC ............ H01L 27/3213; H01L 27/3223; A61N 5/0618; F21V 9/16; F21V 9/08; A61B 19/5202
See application file for complete search history.

(56) References Cited

U.S. PATENT DOCUMENTS

| | | |
|---|---|---|
| 2005/0280008 A1 | 12/2005 | Ricks et al. |
| 2007/0286944 A1 | 12/2007 | Yokoyama et al. |
| 2011/0140139 A1 | 6/2011 | Jeong et al. |
| 2014/0353636 A1* | 12/2014 | Baek .................. H01L 27/3213 257/40 |
| 2015/0362151 A1* | 12/2015 | Van Bommel ....... A61B 1/0638 362/231 |

FOREIGN PATENT DOCUMENTS

| | | |
|---|---|---|
| CN | 105322096 A | 2/2016 |
| WO | WO 2006/073908 A2 | 7/2006 |

* cited by examiner

*Primary Examiner* — Joseph L Williams
(74) *Attorney, Agent, or Firm* — Birch, Stewart, Kolasch & Birch, LLP

(57) ABSTRACT

Discussed is an organic light emitting display (OLED) apparatus which facilitates to prevent a color deviation for a white color of the OLED apparatus from being increased, and thus improves the properties of color change rate in color coordinates for the white light. The OLED apparatus may include a plurality of light emitting devices for emitting light of different colors, wherein the sum of the full width at half maximum of main peak wavelength of light respectively emitted from each of the plurality of light emitting devices is 75 nm or more when the white light is emitted from the OLED apparatus.

22 Claims, 11 Drawing Sheets

ORGANIC LIGHT EMITTING DISPLAY APPARATUS WITH A PLURALITY OF LIGHT EMITTING DEVICES FOR EMITTING LIGHT OF DIFFERENCE COLORS

CROSS REFERENCE TO RELATED APPLICATIONS

This application claims the priority benefit of the Korean Patent Application No. 10-2015-0161112 filed on Nov. 17, 2015, which is hereby incorporated by reference as if fully set forth herein.

BACKGROUND OF THE INVENTION

Field of the Disclosure

The embodiments of the present disclosure relate to an organic light emitting display apparatus (OLED apparatus), and more particularly, to an OLED apparatus which facilitates to improve properties of a color change rate in color coordinates for white light by controlling a full width at half maximum (FWHM) of a main peak wavelength of a light emitted from each of a plurality of light emitting devices.

Discussion of the Related Art

An OLED apparatus is a next generation display apparatus having self-luminance properties. In more detail, the OLED apparatus is a display apparatus for displaying an image by producing exciton through a recombination of hole and electron, which are injected from anode and cathode, in a light emitting layer, and generating a light with a specific wavelength by an energy emission of the produced exciton.

Unlike a liquid crystal display apparatus (LCD apparatus), the OLED apparatus does not require an additional light source. Thus, the OLED apparatus has light weight and thin profile. In comparison to the LCD apparatus, the OLED apparatus has various advantages of wide viewing angle, good contrast ratio, rapid response speed and low power consumption, whereby the OLED apparatus has attracted great attention as the next generation display apparatus.

The OLED apparatus may include a plurality of light emitting devices which emit lights with different colors. Each of the plurality of light emitting devices includes an anode, a cathode, and a patterned emission layer disposed between the anode and the cathode. The patterned emission layer may be separately disposed on every sub pixel so as to emit lights of different colors every sub pixel. For example, if the OLED apparatus includes red, green, and blue light emitting devices, the red light emitting device includes a red patterned emission layer separately disposed in a red sub pixel, the green light emitting device includes a green patterned emission layer separately disposed in a green sub pixel, and the blue light emitting device includes a blue patterned emission layer separately disposed in a blue sub pixel.

SUMMARY

A plurality of light emitting device may have different stack structures in consideration of the properties of each patterned emission layer separately disposed on every sub pixel, for example, material or wavelength of the emitted light. In more detail, each of the plurality of light emitting devices may have structure and thickness determined in consideration of a micro-cavity distance between two electrodes in accordance with the wavelength of light emitted from each patterned emission layer. Herein, the micro-cavity indicates that a light emission efficiency is improved by amplification and constructive interference of the light emitted from the patterned emission layer through repetitive reflection and re-reflection between the two electrodes. For example, if the OLED apparatus includes red, green, and blue light emitting devices, the stack structure and thickness may be differently provided in the respective red, green, and blue light emitting devices in accordance with the properties of each of the red patterned emission layer, the green patterned emission layer, and the blue patterned emission layer separately disposed in or on every sub pixel.

If each of the plurality of light emitting devices has the stack structure optimized for each patterned emission layer, the light emission efficiency of the OLED apparatus can be largely improved by the aforementioned micro-cavity effect. In other words, an intensity of the light emitted from each light emitting device is amplified at a specific wavelength by the micro-cavity effect, thereby improving a luminance of the OLED apparatus.

However, in according with the increase of the intensity of the light emitted from each light emitting device by the micro-cavity effect, the properties of a viewing angle of the OLED apparatus may be largely lowered. This will be described in detail. If the intensity of the light emitted from each light emitting device is increased by the micro-cavity effect, a color shift in accordance with the viewing angle of the OLED apparatus is also increased, whereby a color seen by a user is changed in accordance with the viewing angle. For instance, if white light of the OLED apparatus is obtained by mixing the lights with the different colors emitted from the plurality of light emitting devices, a color deviation of the white light in accordance with the viewing angle is also increased by the color shift of light respectively emitted from each of the plurality of light emitting devices, thereby degrading a display quality of the OLED apparatus.

In order to overcome or address problems and limitations associated with the color deviation of the white light in accordance with the viewing angle, the present inventor has recognized that it would be necessary to optimize a specific relation between each main peak wavelength of the lights emitted from the plurality of light emitting devices. Through various experiments, the present inventor proposes an OLED apparatus which facilitates to improve the properties of a color change rate in the color coordinates for the white light by optimizing a full width at half maximum (FWHM) of a main peak wavelength of light respectively emitted from each of the plurality of light emitting devices.

To achieve these and other advantages and in accordance with the purpose of embodiments of the disclosure, as embodied and broadly described herein, there is provided an OLED apparatus which facilitates to reduce a color deviation of white light in accordance with a viewing angle by controlling a full width at half maximum (FWHM) of a main peak wavelength of light emitted from each of a plurality of light emitting devices.

An aspect of the embodiments of the present disclosure is directed to provide an OLED apparatus which facilitates to reduce a color deviation of white light in accordance with a viewing angle by controlling a FWHM of a main peak wavelength of light emitted from each of a plurality of light emitting devices.

It is to be understood that both the foregoing general description and the following detailed description of embodiments of the present disclosure are exemplary and explanatory and are intended to provide further explanation of the disclosure as claimed.

BRIEF DESCRIPTION OF THE DRAWINGS

The accompanying drawings, which are included to provide a further understanding of embodiments of the disclosure and are incorporated in and constitute a part of this application, illustrate embodiment(s) of the disclosure and together with the description serve to explain the principle of embodiments of the disclosure. In the drawings.

DETAILED DESCRIPTION OF THE PREFERRED EMBODIMENTS

Figure 1:
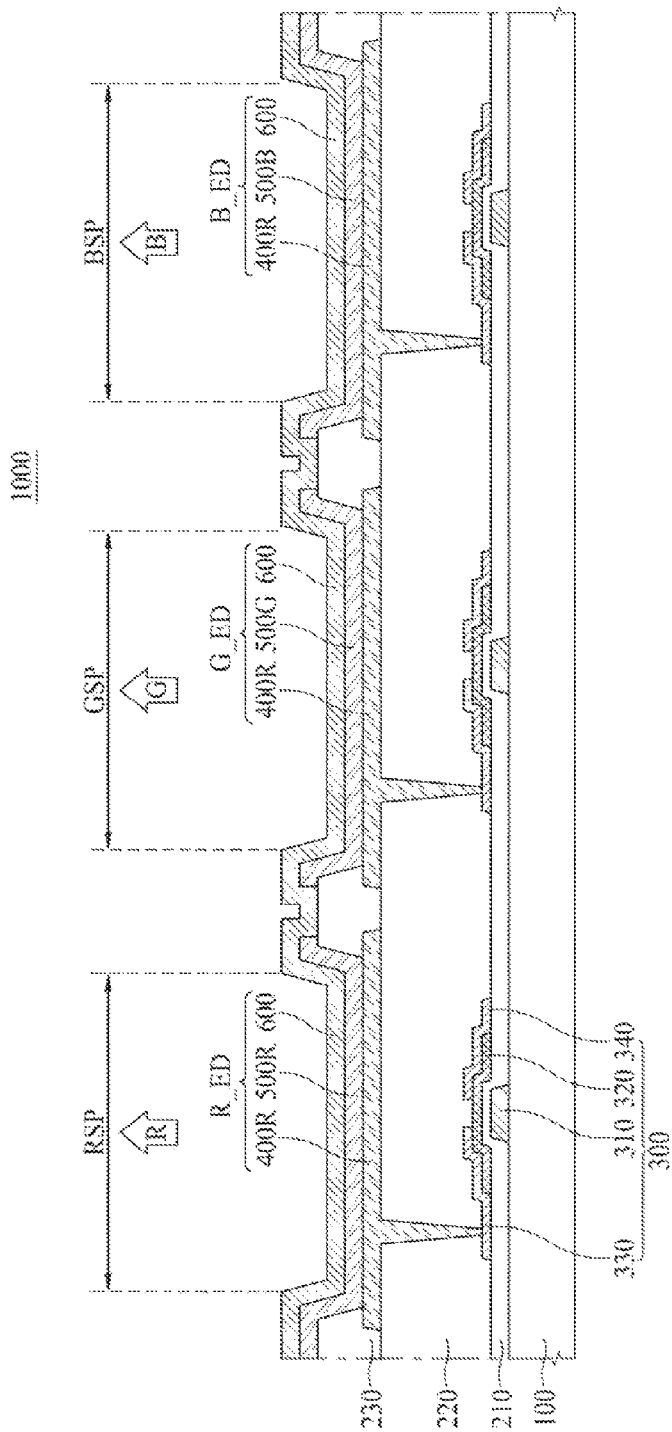
FIG. 1 is a cross sectional view illustrating an OLED apparatus according to one embodiment of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In description of embodiments of the present disclosure, when a structure (for example, an electrode, a line, a wiring, a layer, or a contact) is described as being formed at an upper portion/lower portion of another structure or on/under the other structure, this description should be construed as including a case where the structures contact each other and moreover, a case where a third structure is disposed therebetween.

In describing a time relationship, for example, when the temporal order is described as 'after~', 'subsequent~', 'next~', and 'before~%', a case which is not continuous may be included unless 'just' or 'direct' is used.

In description of embodiments of the present disclosure, if two elements are overlapped with each other, the two elements may be at least partially overlapped with each other regardless of another element interposed in-between, and they may be referred to as various names.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

For convenience of explanation, a size and thickness of each element may be shown as exemplary in the drawings, but not limited to the shown size and thickness.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, an organic light emitting display apparatus (OLED apparatus) according to embodiments of the present disclosure will be described in detail with reference to the accompanying drawings.

FIG. 1 is a cross sectional view illustrating an OLED apparatus 1000 according to one embodiment of the present disclosure. All the components of the OLED apparatus according to all embodiments of the present disclosure are operatively coupled and configured. Referring to FIG. 1, the OLED apparatus 1000 may include a substrate 100, a thin film transistor 300, and a plurality of light emitting devices (ED).

The OLED apparatus 1000 may include a plurality of sub pixels (SP). The sub pixel (SP) indicates a minimum unit for emitting light, which is referred to as a sub pixel region. Also, the plurality of sub pixels (RSP, GSP, and BSP) may constitute one pixel for expressing white light. For example, as shown in FIG. 1, the red sub pixel (RSP), the green sub pixel (GSP), and the blue sub pixel (BSP) may constitute one pixel. However, it is not limited to this structure, that is, various pixel designs are possible.

Referring to FIG. 1, the OLED apparatus 1000 may include the thin film transistor 300 and the light emitting device (ED) provided for every sub pixel (SP). The thin film transistor 300 is disposed on the substrate 100, wherein the thin film transistor 300 supplies a signal to the light emitting device (ED). The thin film transistor 300 shown in FIG. 1 may be a driving thin film transistor connected with an anode 400 of the light emitting device (ED). In each sub pixel (SP), there may be an additionally-provided switching thin film transistor or capacitor for driving the light emitting device (ED).

The substrate 100 may be formed of an insulating material, for example, a flexible film of glass or polyimide-based material.

The thin film transistor 300 may include a gate electrode 310, an active layer 320, a source electrode 330, and a drain electrode 340. Referring to FIG. 1, the gate electrode 310 is disposed on the substrate 100, and the gate insulating layer 210 covers the gate electrode 310. The active layer 320 is disposed on the gate insulating layer 210, and is overlapped with the gate electrode 310. The source electrode 330 and the drain electrode 340 are disposed on the active layer 320, wherein the source electrode 330 and the drain electrode 340 are spaced apart from each other.

The gate electrode 310, the source electrode 330, and the drain electrode 340 are formed of a conductive material, for example, a single-layered structure or multi-layered structure including at least one among molybdenum (Mo), aluminum (Al), chrome (Cr), aurum (Au), titanium (Ti), nickel (Ni), neodymium (Nd), cupper (Cu), and their alloys, but not limited to these materials.

The active layer 320 may be formed of any one of amorphous silicon (a-Si), polycrystalline silicon (poly-Si), oxide, and organic materials, but not limited to these materials.

The gate insulating layer 210 may be formed in a single-layered structure or multi-layered structure of inorganic material including at least one among, for example, silicon oxide (SiOx), silicon nitride (SiNx), and etc.

FIG. 1 shows the thin film transistor 300 having a staggered structure, but not limited to this structure. The thin film transistor 300 may have a coplanar structure instead of the staggered structure.

Then, a planarization layer 220 is disposed on the thin film transistor 300. The planarization layer 220 exposes a predetermined portion of the source electrode 330. The planarization layer 220 may have a single-layered structure or multi-layered structure, and the planarization layer 200 may be formed of an organic material. For example, the planarization layer 220 may be formed of polyimide, acryl, and etc.

The OLED apparatus 1000 shown in FIG. 1 is a top emission type. In this case, the light (R, G, and B) emitted from light emitting units (500R, 500G, and 500B) pass through the cathode 600, and then the light is emitted to an upper direction. In case of the top emission type OLED apparatus 1000, the light (R, G, and B) emitted from the light emitting units (500R, 500G, and 500B) is not advanced to a lower direction (or a direction passing through the substrate 100) so that it is possible to provide the thin film transistor 300 which is overlapped with the light emitting device (ED), and is disposed between the light emitting device (ED) and the substrate 100. Accordingly, an aperture ratio of the top emission type OLED apparatus 1000 may be more improved in comparison to an aperture ratio of a bottom emission type OLED apparatus so that it is possible to realize a high resolution in the OLED apparatus 1000.

The plurality of light emitting devices (R_ED, G_ED, and B_ED) for emitting the light of different colors (R, G, and B) may be disposed on the planarization layer 220. In detail, as shown in FIG. 1, the red light emitting device (R_ED) for emitting the red light (R) is disposed in the red sub pixel (RSP), and the red light emitting device (R_ED) includes the anode 400R, the red light emitting unit 500R, and the cathode 600. Also, the green light emitting device (G_ED) for emitting the green light (G) is disposed in the green sub pixel (GSP), and the green light emitting device (G_ED) includes the anode 400G, the green light emitting unit 500G, and the cathode 600. Also, the blue light emitting device (B_ED) for emitting the blue light (B) is disposed in the blue sub pixel (BSP), and the blue light emitting device (B_ED) includes the anode 400B, the blue light emitting unit 500B, and the cathode 600. White light is obtained by mixing the light (R, G, and B) emitted from the plurality of light emitting devices (R_ED, G_ED, and B_ED).

A bank 230 is provided to divide the sub pixel (SP), and the bank 230 covers an end of the anode 400. Referring to FIG. 1, the bank 230 exposes a predetermined portion of an upper surface of the anode 400. The bank 230 may be formed of an organic material, for example, any one of polyimide and photoacryl, but not limited to these materials.

Figure 2:
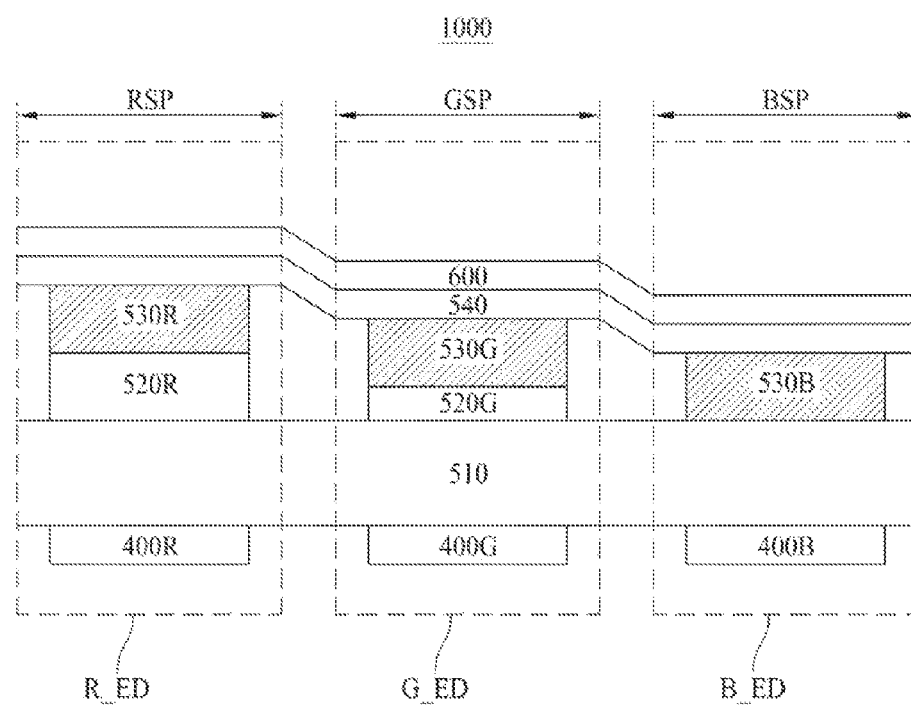
FIG. 2 is a cross sectional view illustrating certain components of the OLED apparatus according to one embodiment of the present disclosure.

FIG. 2 is a cross sectional view illustrating main components of the OLED apparatus 1000 according to one embodiment of the present disclosure, which is a cross sectional view for explaining a stack structure of the plurality of light emitting devices (R_ED, G_ED, and B_ED) of the OLED apparatus 1000 shown in FIG. 1.

Each of the plurality of light emitting devices (R_ED, G_ED, and B_ED) included in the OLED apparatus 1000 includes the anode 400, the cathode 600, and the light emitting unit 500 disposed between the anode 400 and the cathode 600. The light emitting unit 500 indicates all layers disposed between the anode 400 and the cathode 600, or a stack structure of all layers disposed between the anode 400 and the cathode 600.

Referring to FIGS. 1 and 2, the red light emitting device (R_ED) disposed in the red sub pixel (RSP) includes the anode 400R, the cathode 600, and the red light emitting unit 500R having a hole transport layer 510, a patterned hole transport layer 520R, a red patterned emission layer 530R, and an electron transport layer 540. The green light emitting device (G_ED) disposed in the green sub pixel (GSP) includes the anode 400G, the cathode 600, and the green light emitting unit 500G having a hole transport layer 510, a patterned hole transport layer 520G, a green patterned emission layer 530G, and an electron transport layer 540. The blue light emitting device (B_ED) disposed in the blue sub pixel (BSP) includes the anode 400B, the cathode 600, and the blue light emitting unit 500B having a hole transport layer 510, a blue patterned emission layer 530B, and an electron transport layer 540.

The plurality of anodes 400R, 400G, and 400B are respectively overlapped with the red sub pixel (RSP), the green sub pixel (GSP), and the blue sub pixel (BSP), wherein each of the plurality of anodes 400R, 400G, and 400B is separately disposed on every sub pixel (RSP, GSP, and BSP). The plurality of anodes 400 are electrodes for supplying or transmitting holes to the patterned emission layers 530R, 530G, and 530B, and the plurality of anodes 400 are connected with the source electrode 330 of each thin film transistor 300, but not limited to this structure. According to the kind of thin film transistor 300, the anode 400 may be connected with the drain electrode 340. The anode 400 is separately disposed on every sub pixel, whereby the anode 400 may be referred to as a patterned electrode.

Each of the plurality of anodes 400R, 400G, and 400B may include a reflection layer for smoothly reflecting the light (R, G, and B) emitted from the light emitting unit 500R, 500G, and 500B to an upper direction (or a direction passing through the cathode 600). For example, the anode 400 may be formed in a dual-layered structure of a transparent layer and a reflection layer. The transparent layer supplies or transmits the hole to the light emitting unit 500, and the reflection layer reflects the light (R, G, and B) emitted from the light emitting unit 500. According to another example, the anode 400 may be formed in a three-layered structure of a transparent layer, a reflection layer, and another transparent layer. In this case, the transparent layer may be formed of TCO (transparent conductive oxide) material such as ITO (indium tin oxide) or IZO (indium zinc oxide), and the reflection layer may be formed of a metal material such as copper (Cu), argentums (Ag), and palladium (Pd). According to another example, the anode 400 may be formed of a single-layered structure of a material or structure having the properties for supplying or transmitting the hole to the light emitting unit 500 and reflecting the light (R, G, and B) emitted from the light emitting unit 500.

The cathode 600 is provided in the plurality of sub pixels (RSP, GSP, and BSP) in common. The cathode 600 is an electrode for supplying or transmitting the electron to the patterned emission layer 530R, 530G, and 530B of the light emitting unit 500R, 500G, and 500B. The cathode 600 has properties of transparency to pass the light (R, G, and B) of the light emitting unit 500R, 500G, and 500B therethrough. For example, the cathode 600 may be formed of thin metal material, TCO (transparent conductive oxide) material, such as ITO (indium tin oxide) or IZO (indium zinc oxide). The cathode 600 is shared by the plurality of sub pixels (RSP, GSP, and BSP) in common, whereby the cathode 600 may be referred to as a common electrode.

The hole transport layer 510 is disposed on the plurality of anodes 400R, 400G, and 400B over the plurality of sub pixels (RSP, GSP, and BSP). The hole transport layer 510 transmits the hole from the anode 400 to the patterned emission layer 530R, 530G, and 530B. The hole transport layer 510 may be formed of TPD(N,N'-diphenyl-N,N-bis(3-methylphenyl)-1,1'-bi-phenyl-4,4'-diamine) or NPB(N,N'-di(naphthalen-1-yl)-N,N'-diphenyl-benzidine), but not limited to these materials.

The hole transport layer 510 may extend on the plurality of anodes 400R, 400G, and 400B respectively overlapped with the red sub pixel (RSP), the green sub pixel (GSP), and the blue sub pixel (BSP). The hole transport layer 510 may be formed by the use of common mask with open areas corresponding to all sub pixels (RSP, GSP, and BSP). The hole transport layer 510 may be deposited in the same structure for all sub pixels (RSP, GSP, and BSP) without an individual pattern on every sub pixel (RSP, GSP, and BSP). That is, the hole transport layer 510 is connected or disposed with an extension without disconnection from one sub pixel to the neighboring sub pixel so that the hole transport layer 510 is shared by the plurality of sub pixels.

The plurality of light emitting devices (R_ED, G_ED, and B_ED) of the OLED apparatus 1000 according to one embodiment of the present disclosure may have a patterned emission layer structure. In detail, each of the plurality of light emitting devices (R_ED, G_ED, and B_ED) includes each of the patterned emission layers 530R, 530G, and 530B between each of the anodes 400R, 400G, and 400B and the cathode 600. The patterned emission layers 530R, 530G, and 530B are separately disposed on every sub pixel (RSP, GSP, and BSP). Referring to FIG. 2, the red light emitting device (R_ED) includes the red patterned emission layer 530R between the hole transport layer 510 and the cathode 600, the green light emitting device (G_ED) includes the green patterned emission layer 530G between the hole transport layer 510 and the cathode 600, and the blue light emitting device (B_ED) includes the blue patterned emission layer 530B between the hole transport layer 510 and the cathode 600.

The patterned emission layers 530R, 530G, and 530B are light emitting layers which emit the light of the different colors, and the patterned emission layers 530R, 530G, and 530B are divided on every sub pixel (RSP, GSP, and BSP). The patterned emission layer 530R, 530G, and 530B may have the same size as that of each sub pixel (RSP, GSP, and BSP), or the patterned emission layers 530R, 530G, and 530B may be disconnected between each of the neighboring sub pixels (RSP, GSP, and BSP) even though they may not have the same size. In this case, it may be referred to as the patterned emission layer 530R, 530G, and 530B disposed on every sub pixel (RSP, GSP, and BSP), or the patterned emission layer 530R, 530G, and 530B separately disposed on every sub pixel (RSP, GSP, and BSP). For example, as shown in FIG. 1, each of the patterned emission layers 530R, 530G, and 530B included in each of the light emitting devices (R_ED, G_ED, and B_ED) may extend to an upper surface of the bank 230 out of each sub pixel (RSP, GSP, and BSP), and the neighboring two patterned emission layers may be spaced apart from each other on the bank 230. According to a mask design, at least predetermined portions of the neighboring two patterned emission layers may be overlapped on the upper surface of the bank 230.

The plurality of light emitting devices (R_ED, G_ED, and B_ED) may be formed of the light emitting units 500R, 500G, and 500B with the different stack structures in consideration of the properties, for example, emitting light of wavelength or material and etc., of the patterned emission layers 530R, 530G, and 530B respectively disposed on every sub pixel (RSP, GSP, and BSP). In more detail, the light emitting unit 500R of the red light emitting device (R_ED) may have structure and thickness determined in consideration of a micro-cavity distance between the anode 400R and the cathode 600 in consideration of a wavelength of light emitted from the red patterned emission layer 530R. Herein, the micro-cavity indicates that light emission efficiency is improved by amplification and constructive interference of the light emitted from the patterned emission layer 530R, 530G, and 530B through repetitive reflection and re-reflection between the two electrodes 400 and 600.

Referring to FIG. 2, a value of a wavelength of the light emitted from the red patterned emission layer 530R is larger than a value of a wavelength of the light emitted from the green patterned emission layer 530G or the blue patterned emission layer 530B. Accordingly, the light emitting unit 500R of the red light emitting device (R_ED) includes the patterned hole transport layer 520R overlapped with the red sub pixel (RSP) between the red patterned emission layer 530R and the hole transport layer 510 so that it is possible to optimize the micro-cavity distance between the two electrodes 400R and 600. In the same way, a value of a wavelength of the light emitted from the green patterned emission layer 530G is larger than a value of a wavelength of the light emitted from the blue patterned emission layer 530B. Accordingly, the light emitting unit 500G of the green light emitting device (G_ED) includes the patterned hole transport layer 520G overlapped with the green sub pixel (GSP) between the green patterned emission layer 530G and the hole transport layer 510 so that it is possible to optimize the micro-cavity distance between the two electrodes 400G and 600.

The patterned hole transport layers 520R and 520G optimize the micro-cavity distances of the red light emitting device (R_ED) and the green light emitting device (G_ED), and also smoothly transmit the hole from the anodes 400R and 400G to the respective patterned emission layers 530R and 530G. The patterned hole transport layer 520R and 520G may be TPD(N,N'-diphenyl-N,N-bis(3-methylphenyl)-1,1'-bi-phenyl-4,4'-diamine) or NPB(N,N'-di(naphthalen-1-yl)-N,N'-diphenyl-benzidine), but not limited to these materials. According to a design, the patterned hole transport layers 520R and 520G and the hole transport layer 510 may be formed of the same material.

The electron transport layer 540 is disposed on the patterned emission layers 530R, 530G, and 530B over the plurality of sub pixels (RSP, GSP, and BSP). The electron transport layer 540 transmits the electron from the cathode 600 to the patterned emission layers 530R, 530G, and 530B. For example, the electron transport layer 540 may be formed of PBD(2-(4-biphenyl)-5-(4-tert-butylphenyl)-1,3,4-oxadiazole),TAZ(3-(4-biphenyl)-4-phenyl-5-tertbutylphenyl-1,2, 4-triazole), Liq(8-hydroxyquinolinolato-lithium),BAlq(Bis (2-methyl-8-quinolinolate)-4-(phenylphenolato) aluminium), TPBi(2,2',2'-(1,3,5-benzinetriyl) -tris(1-phenyl-1-H-benzimidazole), and etc., but not limited to these materials.

The electron transport layer 540 may extend on the patterned emission layers 530R, 530G, and 530B respectively overlapped with the red sub pixel RSP, the green sub pixel GSP, and the blue sub pixel BSP. The electron transport layer 540 may be formed by the use of common mask with open areas corresponding to all sub pixels (RSP, GSP, and BSP). The electron transport layer 540 may be deposited in the same structure for all sub pixels (RSP, GSP, and BSP) without an individual pattern on every sub pixel (RSP, GSP, and BSP). That is, the electron transport layer 540 is connected or disposed with an extension without disconnection from one sub pixel to the neighboring sub pixel so that the electron transport layer 540 is shared by the plurality of sub pixels.

According to a design, each of the red light emitting device (R_ED), the green light emitting device (G_ED), and the blue light emitting device (B_ED) may further include at least one among a hole injection layer, an electron injection layer, a hole blocking layer, and an electron blocking layer. In the same way as the patterned emission layer 530R, 530G, and 530B, according to a design, the hole transport layer 510 and the electron transport layer 540 may be separately disposed on every sub pixel (RSP, GSP, and BSP).

White light is obtained by mixing the light (R, G, and B) emitted from the red light emitting device (R_ED), the green light emitting device (G_ED), and the blue light emitting device (B_ED). In this case, a range of a main peak wavelength of the red light (R) emitted from the red light emitting device (R_ED) or the red light (R) emitted from the OLED apparatus 1000 may be a range from 600 nm to 650 nm. Also, a range of a main peak wavelength of the green light (G) emitted from the green light emitting device (G_ED) or the green light (G) emitted from the OLED apparatus 1000 may be a range from 520 nm to 560 nm. Also, a range of a main peak wavelength of the blue light (B) emitted from the blue light emitting device (B_ED) or the blue light (B) emitted from the OLED apparatus 1000 may be a range from 430 nm to 480 nm.

As described above, the plurality of light emitting devices (R_ED, G_ED, and B_ED) of the OLED apparatus 1000 have the stack structure optimized for the respective patterned emission layers 530R, 530G, and 530B, whereby an intensity of light emitted from each light emitting device (R_ED, G_ED, and B_ED) is amplified at a specific wavelength by the micro-cavity effect, to thereby improve a luminance of the OLED apparatus 1000. However, according as the intensity of light emitted from each light emitting device (R_ED, G_ED, and B_ED) is increased by the micro-cavity effect, a color shift is also increased in accordance with a viewing angle of the OLED apparatus 1000, whereby a color seen by a user is changed in accordance with a viewing angle. Especially, if the white color is obtained by mixing the light (R, G, and B) emitted from the red light emitting device (R_ED), the green light emitting device (G_ED), and the blue light emitting device (B_ED), a color deviation of the white color becomes large in accordance with a viewing angle by the color shift of light respectively emitted from each of the plurality of light emitting devices (R_ED, G_ED, and B_ED), thereby degrading a picture quality of the OLED apparatus 1000.

In the OLED apparatus 1000 according to one embodiment of the present disclosure, the color deviation of white light in accordance with a viewing angle of the OLED apparatus 1000 is reduced by optimizing a full width at half maximum (FWHM) of the main peak wavelength of light respectively emitted from each of the plurality of light emitting devices (R_ED, G_ED, and B_ED).

In detail, in case of the OLED apparatus 1000 including the plurality of light emitting devices (R_ED, G_ED, and B_ED) for emitting the light having the different colors, if the sum of the full width at half maximum (FWHM) of the main peak wavelength of the light respectively emitted from each of the plurality of light emitting devices (R_ED, G_ED, and B_ED) is 75 nm or more, it is possible to improve the properties of color change rate in the color coordinates for the white light of the OLED apparatus 1000. This will be described in detail with reference to FIGS. 3 to 11.

Figure 3A:
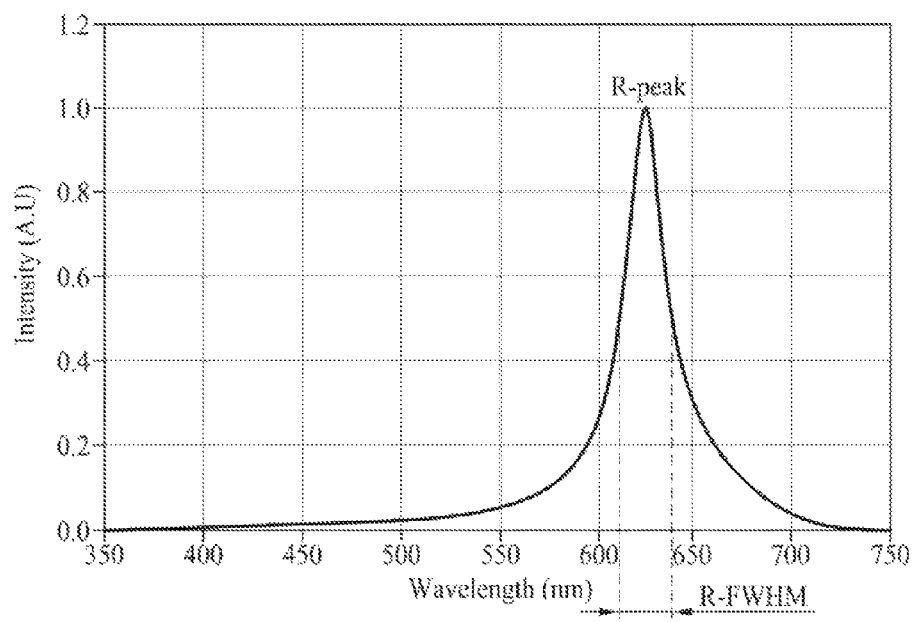
FIGS. 3A to 3C are graphs illustrating a full width at half maximum (FWHM) of a main peak wavelength of each of red, green and blue lights in a comparative example.
Figure 3B:
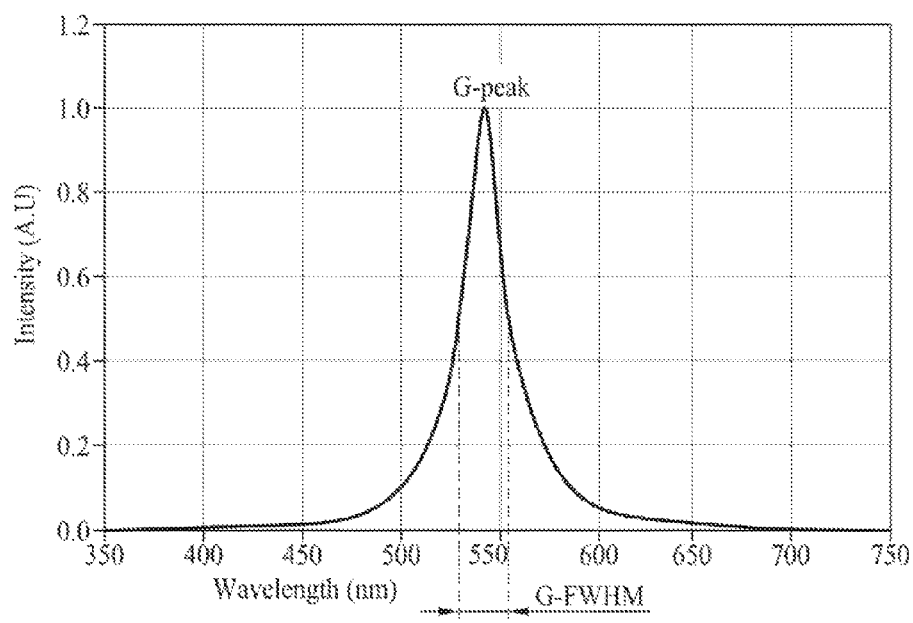
Figure 3C:
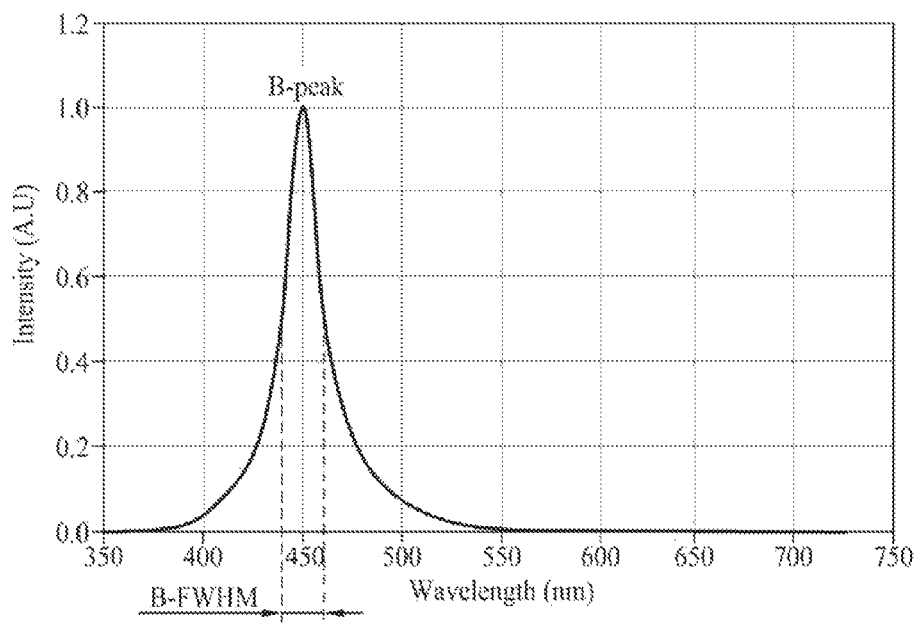
Figure 5A:
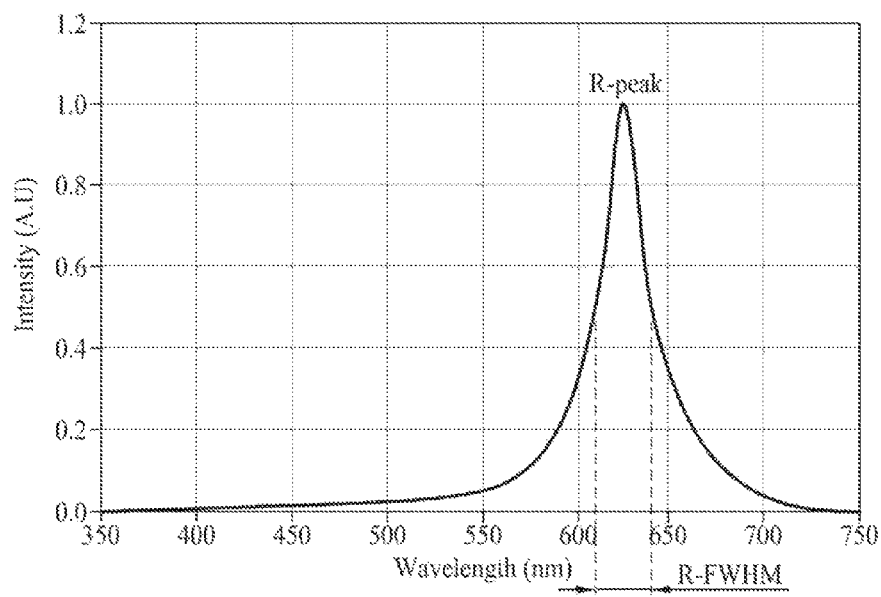
FIGS. 5A to 5C are graphs illustrating a full width at half maximum (FWHM) of a main peak wavelength of each of red, green and blue lights in the embodiment 1 of the present disclosure.
Figure 5B:
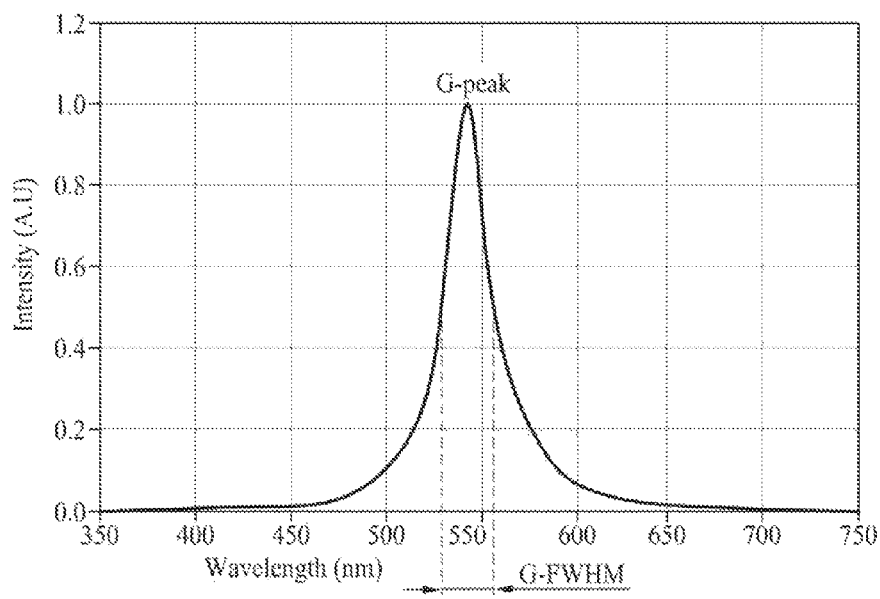
Figure 5C:
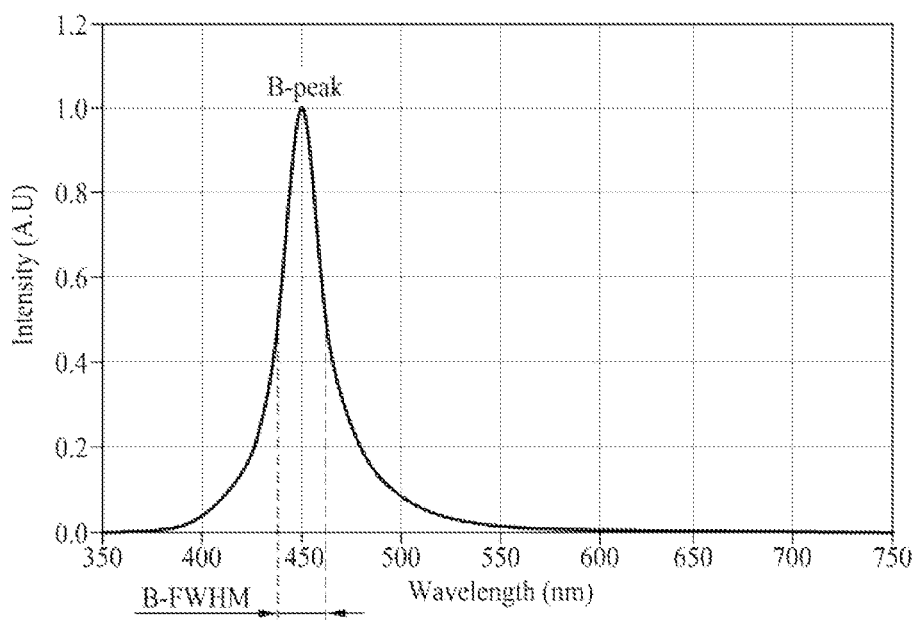
Figure 7A:
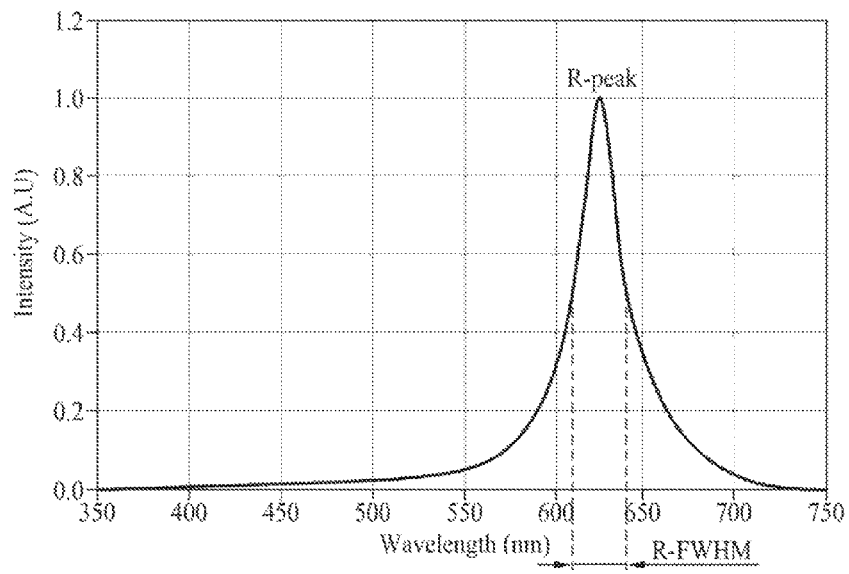
FIGS. 7A to 7C are graphs illustrating a full width at half maximum (FWHM) of a main peak wavelength of each of red, green and blue lights in the embodiment 2 of the present disclosure.
Figure 7B:
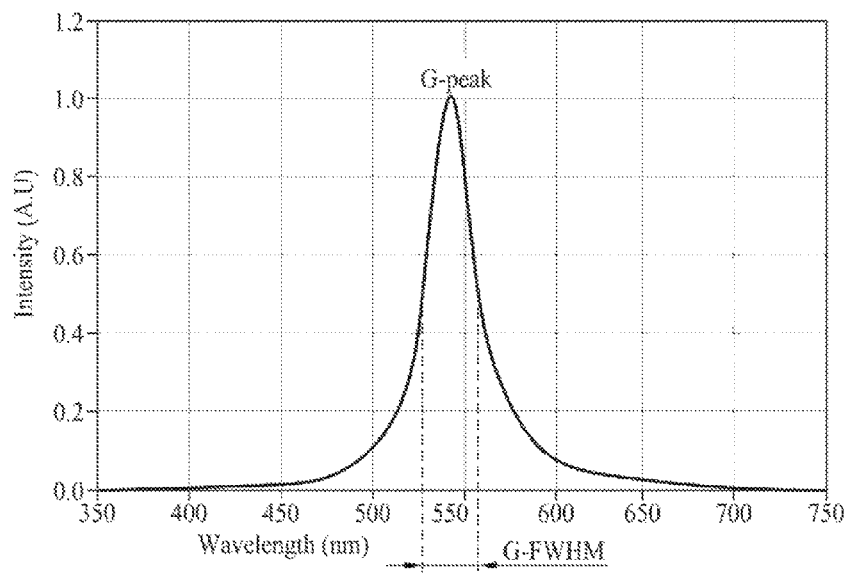
Figure 7C:
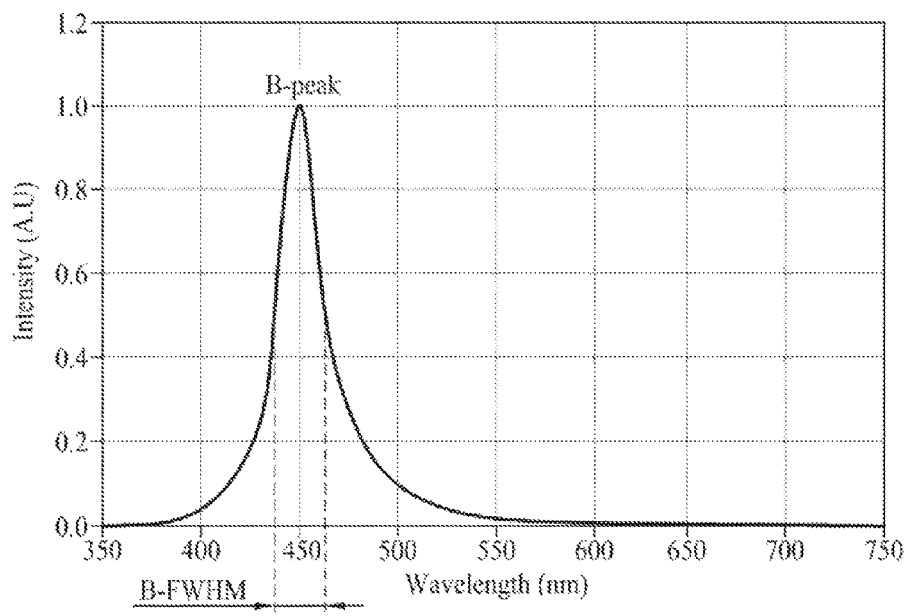
Figure 9A:
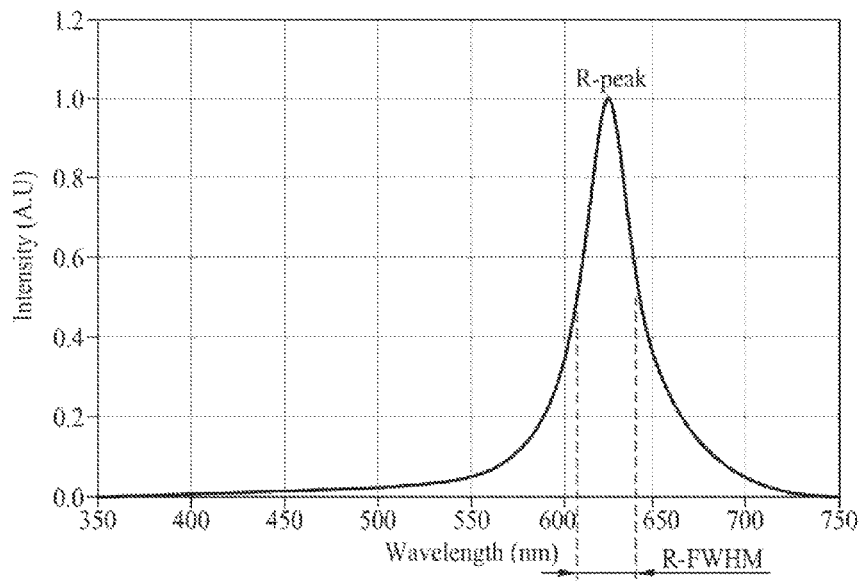
FIGS. 9A to 9C are graphs illustrating a full width at half maximum (FWHM) of a main peak wavelength of each of red, green and blue lights in the embodiment 3 of the present disclosure.
Figure 9B:
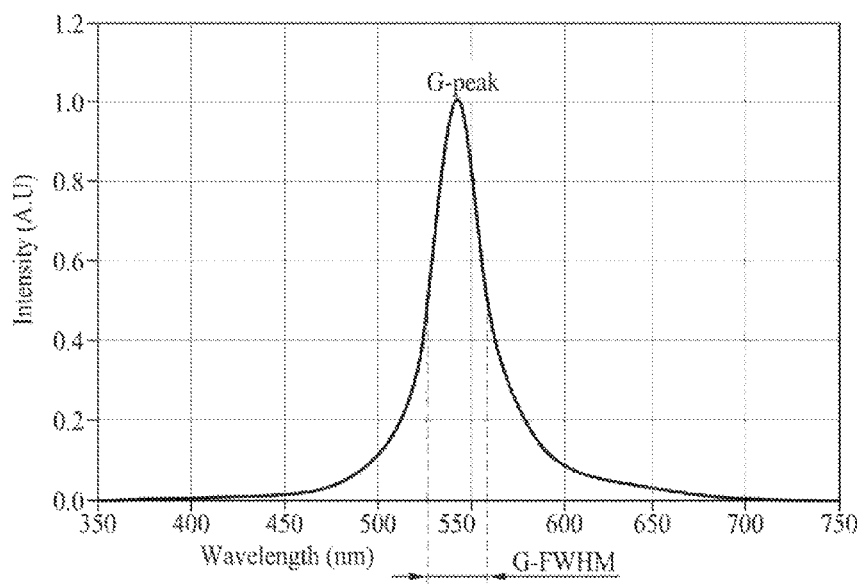
Figure 9C:
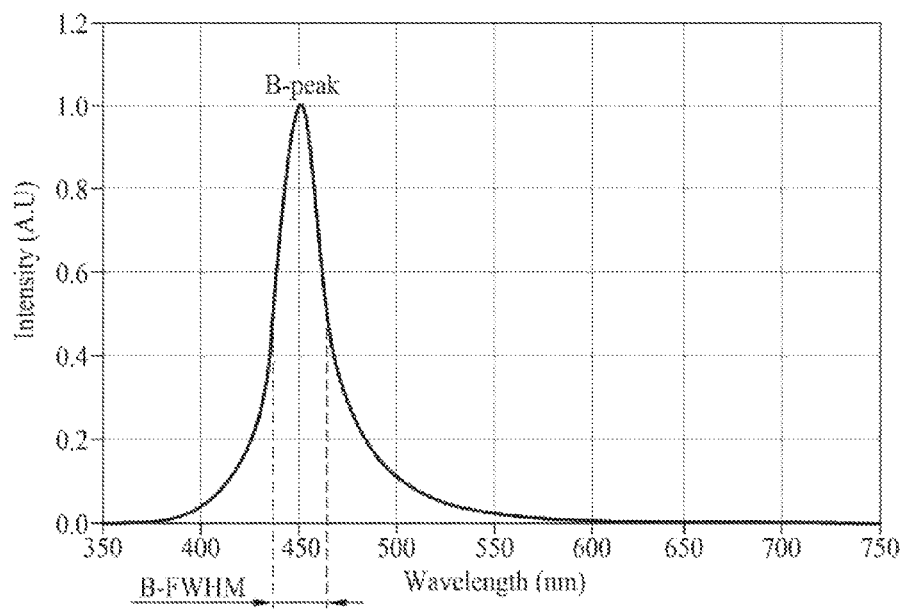

FIGS. 3A to 3C are graphs illustrating a full width at half maximum (FWHM) of a main peak wavelength of each of red, green and blue lights in a comparative example associated with the related art. FIGS. 5A to 5C are graphs illustrating a full width at half maximum (FWHM) of a main peak wavelength of each of red, green and blue lights in the embodiment 1 of the present disclosure. FIGS. 7A to 7C are graphs illustrating a full width at half maximum (FWHM) of a main peak wavelength of each of red, green and blue lights in the embodiment 2 of the present disclosure. FIGS. 9A to 9C are graphs illustrating a full width at half maximum (FWHM) of a main peak wavelength of each of red, green and blue lights in the embodiment 3 of the present disclosure.

In the comparative example and the embodiments 1, 2 and 3, a structure of an OLED apparatus may be the same as a structure of the OLED apparatus 1000 shown in FIGS. 1 and 2. However, there is a difference in the thickness of the cathode 600. That is, in the comparative example and the embodiments 1, 2 and 3, a cathode 600 varies in thickness so that it is possible to control a full width at half maximum (FWHM) of a main peak wavelength of each of red, green and blue lights.

Figure 4:
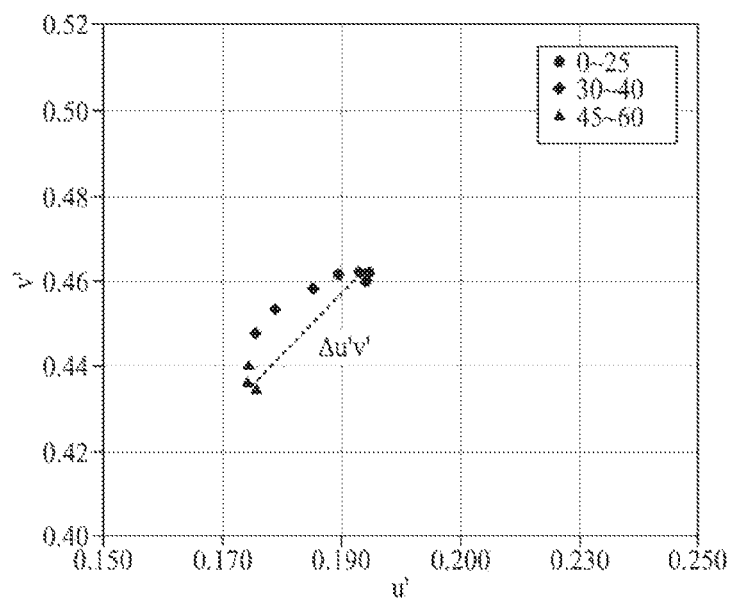
FIG. 4 is a graph illustrating a color change rate of color coordinates for white light according to a viewing angle in the comparative example.

FIGS. 3A to 3C are graphs illustrating a full width at half maximum (FWHM) of a main peak wavelength of each of red, green and blue lights in the comparative example according to the related art. FIG. 4 is a graph illustrating a color change rate of the color coordinates for white light according to a viewing angle in the comparative example.

The OLED apparatus of the comparative example has the same structure as that of the OLED apparatus shown in FIGS. 1 and 2 according to the present disclosure. At this time, a cathode 600 of the OLED apparatus in the comparative example is formed of a metal material, and a thickness of the cathode 600 is more than 180 Å, and is the same as or less than 200 Å. In other words, even though the thickness of the cathode 600 is not identical in the entire areas of the red sub pixel (RSP), the green sub pixel (GSP) and the blue sub pixel (BS), the thickness of the cathode 600 is within a range of about 180 Å to 200 Å, in consideration of process variation. In this case, a transmittance of the cathode 600 has a value of 50% with respect to 460 nm, 43% with respect to 530 nm, and 34% with respect to 620 nm.

The graph shown in FIGS. 3A to 3C shows the main peak wavelengths of the red, green and blue lights when the white light is emitted from the OLED apparatus according to the comparative example. In other words, the graph shown in FIGS. 3A to 3C shows each main peak wavelength of the light emitted from the red light emitting device, the light emitted from the green light emitting device and the light emitted from the blue light emitting device included in the OLED apparatus according to the comparative example.

Referring to FIG. 3A, a main peak wavelength (R-peak) of the red light (R) emitted from the red light emitting device (R_ED) is about 625 nm, and a full width at half maximum (R_FWHM) of the corresponding main peak wavelength (R-peak) of the red light (R) is 26.8 nm. In this case, the full width at half maximum (FWHM) indicates a width of wavelength at a point where an intensity of the main peak wavelength is ½ with respect to a maximum intensity of the main peak wavelength.

Referring to FIG. 3B, a main peak wavelength (G-peak) of the green light (G) emitted from the green light emitting device (G_ED) is about 540 nm, and a full width at half maximum (G_FWHM) of the corresponding main peak wavelength (G-peak) of the green light (G) is 25.1 nm.

Referring to FIG. 3C, a main peak wavelength (B-peak) of the blue light (B) emitted from the blue light emitting device (B_ED) is about 450 nm, and a full width at half maximum (B_FWHM) of the corresponding main peak wavelength (B-peak) of the blue light (B) is 22 nm.

Referring to FIGS. 3A to 3C, when the white light is emitted from the OLED apparatus according to the comparative example, the sum of the full width at half maximum (R_FWHM, G_FWHM, and B_FWHM) of each main peak wavelength of the red light (R), the green light (G) and the blue light (B) is 73.9 nm.

As shown in FIG. 4, the color change rate (Δu'v') of the color coordinates for the white light of the OLED apparatus according to the comparative example has a value of 0.034 or less within a range of a viewing angle of 0° to 60°. Herein, the viewing angle indicates an angle at which an image is viewed by a user. If a user views an image in front of the OLED apparatus, the viewing angle is 0°. The viewing angle is gradually increased from the front to lateral sides. In detail, the viewing angle is gradually increased from the front to the lower, upper, left and right sides. Also, the smaller the color shift according to the viewing angle becomes, the smaller a value of the color change rate (Δu'v') of the color coordinates becomes.

Referring to FIG. 4, when the viewing angle is within a range of 0° to 25°, the color coordinates (u'v') of the white light in the comparative example has the value of about 0.190 and 0.460. When the viewing angle is within a range of 30° to 40°, the color coordinates (u'v') of the white light in the comparative example has the value of about 0.180 and 0.450. When the viewing angle is within a range of 45° to 60°, the color coordinates (u'v') of the white light in the comparative example has the value of about 0.173 and 0.438. That is, according as the viewing angle is increased from 0° to 60°, the color coordinates (u'v') of the white light is gradually changed, whereby the color change rate (Δu'v') of the color coordinates for the white light in the viewing angle of 0° to 60° is about 0.034.

Figure 6:
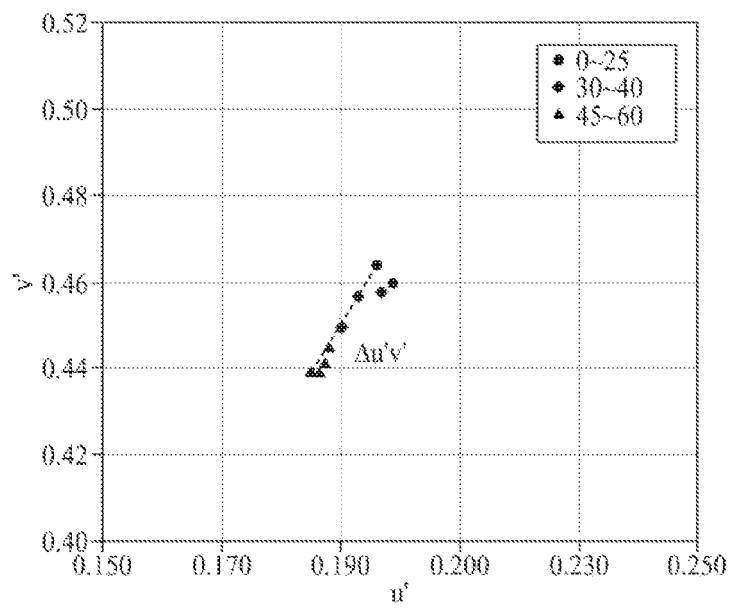
FIG. 6 is a graph illustrating a color change rate of color coordinates for white light according to a viewing angle in the embodiment 1 of the present disclosure.

FIGS. 5A to 5C are graphs illustrating a full width at half maximum (FWHM) of a main peak wavelength of each of red, green and blue lights in the embodiment 1 of the present disclosure. FIG. 6 is a graph illustrating color change rate of the color coordinates for white light according to a viewing angle in the embodiment 1 of the present disclosure.

The OLED apparatus of the embodiment 1 of the present disclosure preferably has the same structure as that of the OLED apparatus 1000 shown in FIGS. 1 and 2. At this time, a cathode 600 of the OLED apparatus in the embodiment 1 is formed of the same metal material as that of the cathode of the comparative example, and a thickness of the cathode 600 is more than 160 Å, and is the same as or less than 180 Å. In other words, even though the thickness of the cathode 600 is not identical in the entire areas of the red sub pixel (RSP), the green sub pixel (GSP) and the blue sub pixel (BS), the thickness of the cathode 600 is within a range of about 160 Å to 180 Å. In this case, a transmittance of the cathode 600 has a value of 55% with respect to 460 nm, 48% with respect to 530 nm, and 39% with respect to 620 nm.

The graph shown in FIGS. 5A to 5C shows the main peak wavelengths of the red, green and blue lights when the white light is emitted from the OLED apparatus according to the embodiment 1 of the present disclosure. In other words, the graph shown in FIGS. 5A to 5C shows each main peak wavelength of the light emitted from the red light emitting device, the light emitted from the green light emitting device and the light emitted from the blue light emitting device included in the OLED apparatus according to the embodiment 1.

Referring to FIG. 5A, a main peak wavelength (R-peak) of the red light (R) emitted from the red light emitting device (R_ED) according to the embodiment 1 is about 625 nm, and a full width at half maximum (R_FWHM) of the corresponding main peak wavelength (R-peak) of the red light (R) is 28.7 nm.

Referring to FIG. 5B, a main peak wavelength (G-peak) of the green light (G) emitted from the green light emitting device (G_ED) according to the embodiment 1 is about 540 nm, and a full width at half maximum (G_FWHM) of the corresponding main peak wavelength (G-peak) of the green light (G) is 27.2 nm.

Referring to FIG. 5C, a main peak wavelength (B-peak) of the blue light (B) emitted from the blue light emitting device (B_ED) according to the embodiment 1 is about 450 nm, and a full width at half maximum (B_FWHM) of the corresponding main peak wavelength (B-peak) of the blue light (B) is 23.9 nm.

Referring to FIGS. 5A to 5C, when the white light is emitted from the OLED apparatus according to the embodiment 1, the sum of the full width at half maximum (R_FWHM, G_FWHM, and B_FWHM) of each main peak wavelength of the red light (R), the green light (G) and the blue light (B) is 79.8 nm.

As shown in FIG. 6, the color change rate (Δu'v') of the color coordinates for the white light of the OLED apparatus according to the embodiment 1 has a value of 0.026 or less within a range of a viewing angle of 0° to 60°.

Referring to FIG. 6, when the viewing angle is within a range of 0° to 25°, the color coordinates (u'v') of the white light in the embodiment 1 has the value of about 0.198 and 0.465. When the viewing angle is within a range of 30° to 40°, the color coordinates (u'v') of the white light in the embodiment 1 has the value of about 0.192 and 0.453. When the viewing angle is within a range of 45° to 60°, the color coordinates (u'v') of the white light in the embodiment 1 has the value of about 0.187 and 0.440. That is, according as the viewing angle is increased from 0° to 60°, the color coordinates (u'v') of the white light is gradually changed, whereby the color change rate (Δu'v') of the color coordinates for the white light in the viewing angle of 0° to 60° is about 0.026.

Figure 8:
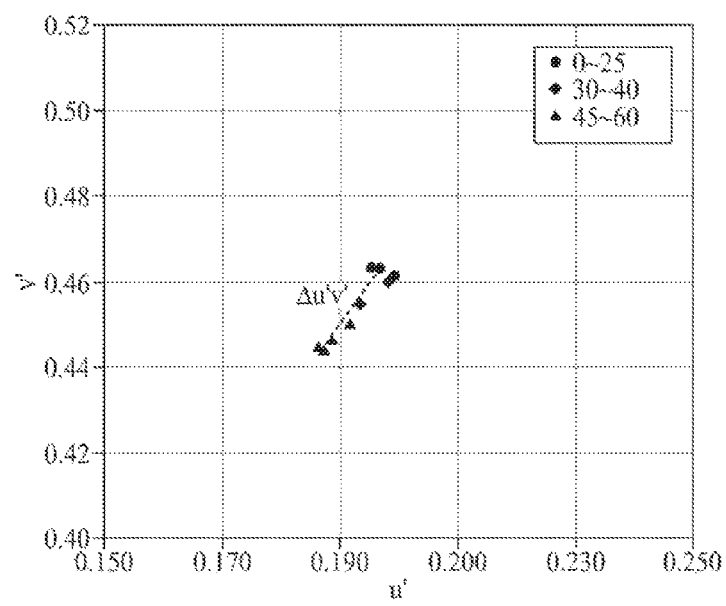
FIG. 8 is a graph illustrating a color change rate of color coordinates for white light according to a viewing angle in the embodiment 2 of the present disclosure.

FIGS. 7A to 7C are graphs illustrating a full width at half maximum (FWHM) of a main peak wavelength of each of red, green and blue lights in the embodiment 2 of the present disclosure. FIG. 8 is a graph illustrating color change rate of the color coordinates for white light according to a viewing angle in the embodiment 2 of the present disclosure.

The OLED apparatus of the embodiment 2 preferably has the same structure as that of the OLED apparatus 1000 shown in FIGS. 1 and 2. At this time, a cathode 600 of the OLED apparatus in the embodiment 2 is formed of the same metal material as that of the cathode of each of the comparative example and the embodiment 1, and a thickness of the cathode 600 is more than 140 Å, and is the same as or less than 160 Å. In other words, even though the thickness of the cathode 600 is not identical in the entire areas of the red sub pixel (RSP), the green sub pixel (GSP) and the blue sub pixel (BS), the thickness of the cathode 600 is within a range of about 140 Å to 160 Å, in consideration of process variation. In this case, a transmittance of the cathode 600 has a value of 61% with respect to 460 nm, 55% with respect to 530 nm, and 46% with respect to 620 nm.

The graph shown in FIGS. 7A to 7C shows the main peak wavelengths of the red, green and blue lights when the white light is emitted from the OLED apparatus according to the embodiment 2. In other words, the graph shown in FIGS. 7A to 7C shows each main peak wavelength of the light emitted from the red light emitting device, the light emitted from the green light emitting device and the light emitted from the blue light emitting device included in the OLED apparatus according to the embodiment 2.

Referring to FIG. 7A, a main peak wavelength (R-peak) of the red light (R) emitted from the red light emitting device (R_ED) according to the embodiment 2 is about 625 nm, and a full width at half maximum (R_FWHM) of the corresponding main peak wavelength (R-peak) of the red light (R) is 31.4 nm.

Referring to FIG. 7B, a main peak wavelength (G-peak) of the green light (G) emitted from the green light emitting device (G_ED) according to the embodiment 2 is about 540 nm, and a full width at half maximum (G_FWHM) of the corresponding main peak wavelength (G-peak) of the green light (G) is 29.5 nm.

Referring to FIG. 7C, a main peak wavelength (B-peak) of the blue light (B) emitted from the blue light emitting device (B_ED) according to the embodiment 2 is about 450 nm, and a full width at half maximum (B_FWHM) of the corresponding main peak wavelength (B-peak) of the blue light (B) is 25.8 nm.

Referring to FIGS. 7A to 7C, when the white light is emitted from the OLED apparatus according to the embodiment 2, the sum of the full width at half maximum (R_FWHM, G_FWHM, and B_FWHM) of each main peak wavelength of the red light (R), the green light (G) and the blue light (B) is 86.7 nm.

As shown in FIG. 8, the color change rate (Δu'v') of the color coordinates for the white light of the OLED apparatus according to the embodiment 2 has a value of 0.021 or less within a range of a viewing angle of 0° to 60°.

Referring to FIG. 8, when the viewing angle is within a range of 0° to 25°, the color coordinates (u'v') of the white light in the embodiment 2 has the value of about 0.198 and 0.463. When the viewing angle is within a range of 30° to 40°, the color coordinates (u'v') of the white light in the embodiment 2 has the value of about 0.194 and 0.457. When the viewing angle is within a range of 45° to 60°, the color coordinates (u'v') of the white light in the embodiment 2 has the value of about 0.189 and 0.443. That is, according as the viewing angle is increased from 0° to 60°, the color coordinates (u'v') of the white light is gradually changed, whereby the color change rate (Δu'v') of the color for the white light in the viewing angle of 0° to 60° is about 0.021.

Figure 10:
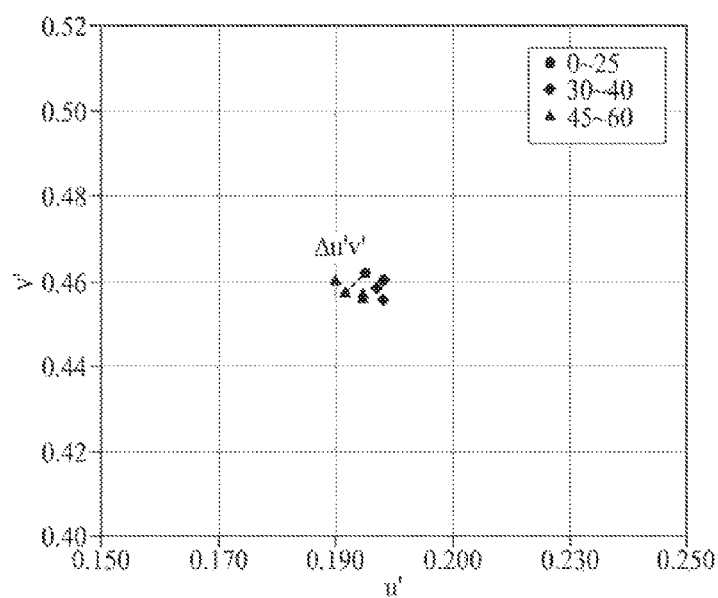
FIG. 10 is a graph illustrating a color change rate of color coordinates for white light according to a viewing angle in the embodiment 3 of the present disclosure.

FIGS. 9A to 9C are graphs illustrating a full width at half maximum (FWHM) of a main peak wavelength of each of red, green and blue lights in the embodiment 3 of the present disclosure. FIG. 10 is a graph illustrating color change rate of the color coordinates for white light according to a viewing angle in the embodiment 3 of the present disclosure.

The OLED apparatus of the embodiment 3 preferably has the same structure as that of the OLED apparatus 1000 shown in FIGS. 1 and 2. At this time, a cathode 600 of the OLED apparatus in the embodiment 3 is formed of the same metal material as that of the cathode of each of the comparative example, the embodiment 1 and the embodiment 2, and a thickness of the cathode 600 is more than 120 Å, and is the same as or less than 140 Å. In other words, even though the thickness of the cathode 600 is not identical in the entire areas of the red sub pixel (RSP), the green sub pixel (GSP) and the blue sub pixel (BSP), the thickness of the cathode 600 is within a range of about 120 Å to 140 Å. In this case, a transmittance of the cathode 600 has a value of 68% with respect to 460 nm, 62% with respect to 530 nm, and 54% with respect to 620 nm.

The graph shown in FIGS. 9A to 9C shows the main peak wavelengths of the red, green and blue lights when the white light is emitted from the OLED apparatus according to the embodiment 3. In other words, the graph shown in FIGS. 9A to 9C shows the main peak wavelength of the light emitted from the red light emitting device, the light emitted from the green light emitting device and the light emitted from the blue light emitting device included in the OLED apparatus according to the embodiment 3.

Referring to FIG. 9A, a main peak wavelength (R-peak) of the red light (R) emitted from the red light emitting device (R_ED) according to the embodiment 3 is about 625 nm, and a full width at half maximum (R_FWHM) of the corresponding main peak wavelength (R-peak) of the red light (R) is 32.2 nm.

Referring to FIG. 9B, a main peak wavelength (G-peak) of the green light (G) emitted from the green light emitting device (G_ED) according to the embodiment 3 is about 540 nm, and a full width at half maximum (G_FWHM) of the corresponding main peak wavelength (G-peak) of the green light (G) is 31.1 nm.

Referring to FIG. 9C, a main peak wavelength (B-peak) of the blue light (B) emitted from the blue light emitting device (B_ED) according to the embodiment 3 is about 450 nm, and a full width at half maximum (B_FWHM) of the corresponding main peak wavelength (B-peak) of the blue light (B) is 27.1 nm.

Referring to FIGS. 9A to 9C, when the white light is emitted from the OLED apparatus according to the embodiment 3, the sum of the full width at half maximum (R_FWHM, G_FWHM, and B_FWHM) of each main peak wavelength of the red light (R), the green light (G) and the blue light (B) is 90.4 nm.

As shown in FIG. 10, the color change rate (Δu'v') of the color coordinates for the white light of the OLED apparatus according to the embodiment 3 has a value of 0.012 or less within a range of a viewing angle of 0° to 60°.

Referring to FIG. 10, when the viewing angle is within a range of 0° to 25°, the color coordinates (u'v') of the white light in the embodiment 3 has the value of about 0.198 and 0.463. When the viewing angle is within a range of 30° to 40°, the color coordinates (u'v') of the white light in the embodiment 3 has the value of about 0.200 and 0.460. When the viewing angle is within a range of 45° to 60°, the color coordinates (u'v') of the white light in the embodiment 3 has the value of about 0.192 and 0.458. That is, according as the viewing angle is increased from 0° to 60°, the color coordinates (u'v') of the white light is gradually changed, whereby the color change rate (Δu'v') of the color coordinates for the white light in the viewing angle of 0° to 60° is about 0.012.

Referring to the comparative example, and the embodiments 1 to 3 of the present disclosure, when the white light is emitted from the OLED apparatus, the sum of the full width at half maximum (FWHM) of the main peak wavelength of the light respectively emitted from each of the plurality of light emitting devices (R_ED, G_ED, and B_ED) is 75 nm or more, whereby the color change rate (Δu'v') of the color coordinates for the white light of the OLED apparatus is 0.030 or less.

If the color change rate (Δu'v') of the color coordinates for the white light of the OLED apparatus is more than 0.030, a user may sense the color deviation for the white light, that is, a user may sense the color shift in accordance with the change of viewing angle. Accordingly, when the color change rate of the color coordinates for the white light of the OLED apparatus is more than 0.030, it may cause degradation of display quality for the white light of the OLED apparatus in accordance with the change of viewing angle. However, if the color change rate (Δu'v') of the color coordinates for the white light of the OLED apparatus is about 0.030 or less, the color shift is imperceptible to a user in accordance with the change of viewing angle, whereby it is possible to prevent display quality for the white light of the OLED apparatus from being degraded in accordance with the change of viewing angle. More preferably, when the white light is emitted from the OLED apparatus, the sum of the full width at half maximum (FWHM) of the main peak wavelength of the light emitted from each of the plurality of light emitting devices (R_ED, G_ED, and B_ED) is 79 nm or less, whereby the color change rate (Δu'v') of the color coordinates for the white light of the OLED apparatus is 0.026 or less. In this case, the color shift is imperceptible to a user in accordance with the change of viewing angle so that it is possible to overcome a problem of degrading the display quality for the white light of the OLED apparatus in accordance with the change of viewing angle.

To this end, the transmittance of the cathode 600 of the OLED apparatus may have 55% or more with respect to 460 nm, 48% or more with respect to 530 nm, and 39% or more with respect to 620 nm. If the cathode 600 is formed of the metal material, the thickness of the cathode 600 is equal to or less than a value of 180 Å.

Referring to the embodiments 1 to 3 of the present disclosure, the value of each of the full width at half maximum (R_FWHM) of the main peak wavelength (R-peak) of the red light (R) and the full width at half maximum (G_FWHM) of the main peak wavelength (G-peak) of the green light (G) is larger than the value of the full width at half maximum (B_FWHM) of the main peak wavelength (B-peak) of the blue light (B). When the OLED apparatus emits the white light by mixing the red light, the green light and the blue light, the color coordinates (u'v') of the white light may be formed at a ratio of about 30% of the red light, about 65% of the green light, and about 5% of the blue light. Accordingly, if each full width at half maximum (R-FWHM and G-FWHM) of the red light and the green light, which relatively highly affects on the white light in comparison to the value of the full width at half maximum (B-FWHM) of the blue light, has the large value, the color shift according to the viewing angle of the red light and the green light is more reduced so that the color change rate (Δu'v') of the color coordinates of the white light according to the viewing angle is also reduced more.

Figure 11:
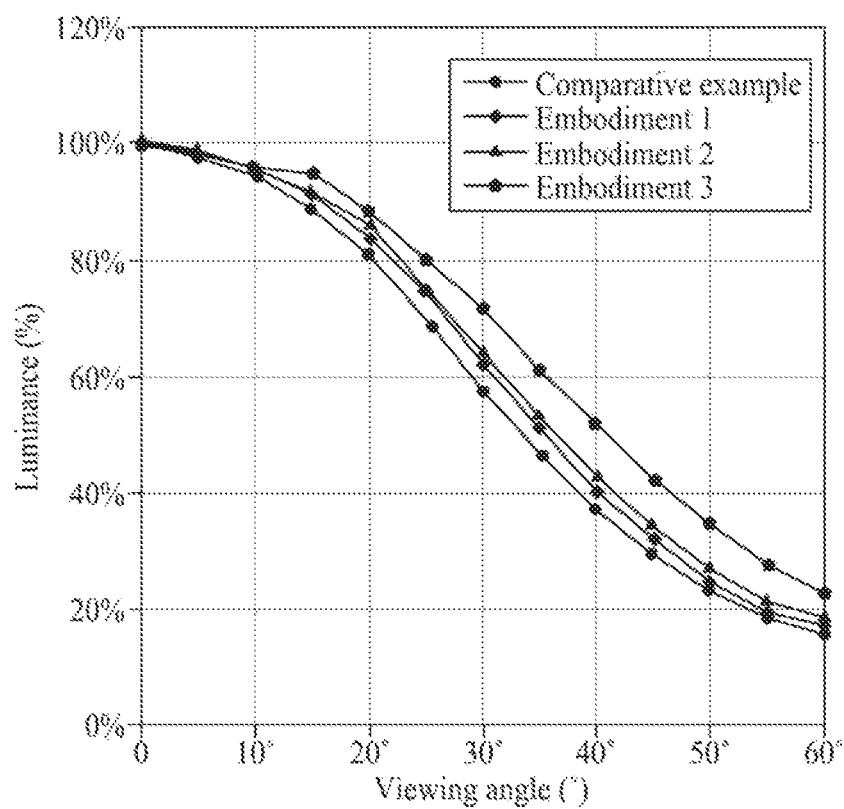
FIG. 11 is a graph illustrating a change of luminance in accordance with a change of viewing angle in the comparative example and the embodiments 1 to 3 of the present disclosure.

FIG. 11 is a graph illustrating the change of luminance in accordance with the change of the viewing angle in the comparative example, and the embodiments 1 to 3 of the present disclosure.

In case of the comparative example, the change of luminance of the white light in the OLED apparatus will be described with reference to FIG. 11. Supposing that the luminance is 100% when the viewing angle is 0°. For a process of changing the viewing angle from 0° to 60°, the luminance of the white light is reduced by about 84%. Under the same condition, in case of the embodiment 1, the luminance of the white light of the OLED apparatus is reduced by about 83% for a process of changing the viewing angle from 0° to 60°. Under the same condition, in case of the embodiment 2, the luminance of the white light of the OLED apparatus is reduced by about 82% for a process of changing the viewing angle from 0° to 60°. Under the same condition, in case of the embodiment 3, the luminance of the white light of the OLED apparatus is reduced by about 80% for a process of changing the viewing angle from 0° to 60°.

As shown in FIG. 11, in case of the OLED apparatuses according to the embodiments 1 to 3 of the present disclosure, the change of luminance reduction when the viewing angle is changed from 0° to 60° is similar to the change of luminance reduction in the comparative example.

When the white light is emitted from the OLED apparatus according to the present disclosure, the sum of the full width at half maximum (R_FWHM, G_FWHM, and B_FWHM) of each of the main peak wavelengths of the light emitted from the red light emitting device, the light emitted from the green light emitting device, and the light emitted from the blue light emitting device is 75 nm or more so that it is possible to improve the properties of color change rate in the color coordinates for the white light of the OLED apparatus. In this case, according as the color change rate of the color coordinates for the white light in accordance with the viewing angle of the OLED apparatus is 0.030 or less, the color deviation for the white light in accordance with the change of viewing angle is reduced, thereby improving the display quality for the white light of the OLED apparatus. The luminance change according to the viewing angle in the OLED apparatuses according to the embodiments 1 to 3 is similar to the luminance change according to the viewing angle in the OLED apparatus according to the comparative example. Accordingly, the OLED apparatus according to the embodiments of the present disclosure facilitates to minimize the change of luminance, and also to improve the properties of color change rate of the color coordinates for the white light in accordance with the viewing angle.

As described above, in case of the OLED apparatus according to the embodiments of the present disclosure, the properties of color change rate in the color coordinates for the white light in accordance with the viewing angle may be improved by controlling the full width at half maximum (FWHM) of the main peak wavelength of the light emitted from each of the plurality of light emitting devices.

Also, in case of the OLED apparatus according to the embodiments of the present disclosure, the color change rate in the color coordinates for the white light in accordance with the viewing angle is reduced by optimizing the full width at half maximum (FWHM) of the main peak wavelength of each of the red light, the green light and the blue light emitted from the OLED apparatus according to the embodiments of the present disclosure so that it is possible to reduce the color deviation for the white light in accordance with the viewing angle, thereby improving the display quality for the white light of the OLED apparatus.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. An organic light emitting display (OLED) apparatus comprising:
   a plurality of light emitting devices for emitting light of different colors,
   wherein a sum of a full width at half maximum of a main peak wavelength of light respectively emitted from each of the plurality of light emitting devices is 75 nm or more when white light is emitted from the OLED apparatus.

2. The OLED apparatus according to claim 1, wherein the plurality of light emitting devices include a red light emitting device, a green light emitting device, and a blue light emitting device.

3. The OLED apparatus according to claim 2, wherein a value of the full width at half maximum of the main peak wavelength of light respectively emitted from the red light emitting device and the green light emitting device is larger than a value of the full width at half maximum of the main peak wavelength of the light emitted from the blue light emitting device.

4. The OLED apparatus according to claim 2,
   wherein the main peak wavelength of the light emitted from the red light emitting device is within a range from 600 nm to 650 nm,
   the main peak wavelength of the light emitted from the green light emitting device is within a range from 520 nm to 560 nm, and
   the main peak wavelength of the light emitted from the blue light emitting device is within a range from 430 nm to 480 nm.

5. The OLED apparatus according to claim 2, wherein a color change rate ($\Delta u'v'$) of color coordinates for the white light in accordance with a viewing angle from 0° to 60° is 0.030 or less.

6. The OLED apparatus according to claim 5, wherein each of the red light emitting device, the green light emitting device, and the blue light emitting device includes a cathode, and a transmittance of the cathode has a value of 55% or more with respect to 460 nm, 48% or more with respect to 530 nm, and 39% or more with respect to 620 nm.

7. The OLED apparatus according to claim 6, wherein the cathode is formed of a metal material, and a thickness of the cathode is 180 Å or less.

8. The OLED apparatus according to claim 7, wherein the color change rate ($\Delta u'v'$) of color coordinates is decreased according to the thickness of the cathode being gradually decreased from 180 Å to 120 Å.

9. The OLED apparatus according to claim 7, wherein the sum of the full width at half maximum of the main peak wavelength of light respectively emitted from the red light emitting device, the green light emitting device, and the blue light emitting device is increased according to the thickness of the cathode being gradually decreased from 180Å to 120 Å.

10. An OLED apparatus comprising:
    a patterned emission layer structure,
    wherein a full width at half maximum of a main peak wavelength of red light, green light and blue light respectively emitted from the OLED apparatus has a value that enables a color change rate of color coordinates for white light in accordance with a viewing angle from 0° to 60° be 0.030 or less when the white light is emitted from the OLED apparatus.

11. The OLED apparatus according to claim 10, wherein a sum of the full width at half maximum of the main peak wavelength of each of red light, green light and blue light emitted from the OLED apparatus is 75 nm or more.

12. The OLED apparatus according to claim 11, wherein a value of the full width at half maximum of the main peak wavelength of each of the red light and the green light is larger than a value of the full width at half maximum of the main peak wavelength of the blue light.

13. The OLED apparatus according to claim 11,
    wherein the main peak wavelength of the red light is within a range from 600 nm to 650 nm,
    the main peak wavelength of the green light is within a range from 520 nm to 560 nm, and
    the main peak wavelength of the blue light is within a range from 430 nm to 480 nm.

14. The OLED apparatus according to claim 11, further comprising:
    a red light emitting device for emitting the red light;
    a green light emitting device for emitting the green light; and
    a blue light emitting device for emitting the blue light.

15. The OLED apparatus according to claim 14, wherein each of the red light emitting device, the green light emitting device and the blue light emitting device includes a cathode, and a transmittance of the cathode has a value of 55% or more with respect to 460 nm, 48% or more with respect to 530 nm, and 39% or more with respect to 620 nm.

16. The OLED apparatus according to claim 15, wherein the cathode is formed of a metal material, and a thickness of the cathode is 180 Å or less.

17. The OLED apparatus according to claim 16, wherein the color change rate ($\Delta u'v'$) of color coordinates is decreased according to the thickness of the cathode being gradually decreased from 180 Å to 120 Å.

18. The OLED apparatus according to claim 16, wherein the sum of the full width at half maximum of the main peak wavelength of light respectively emitted from the red light emitting device, the green light emitting device and the blue light emitting device is increased according to the thickness of the cathode being gradually decreased from 180 Å to 120 Å.

19. The OLED apparatus according to claim 1, wherein the sum of the full width at half maximum of the main peak wavelength of light respectively emitted from each of the plurality of light emitting devices is 90.4 nm or less when white light is emitted from the OLED apparatus.

20. The OLED apparatus according to claim 1, wherein the light of different colors include red light, green light, and blue light, and the white light is emitted by mixing the red light, the green light, and the blue light, and
wherein a color coordinates (u'v') of the white light is formed at a ratio of about 30% of the red light, about 65% of the green light, and about 5% of the blue light.

21. The OLED apparatus according to claim 11, wherein the sum of the full width at half maximum of the main peak wavelength of each of red light, green light and blue light emitted from the OLED apparatus is 90.4 nm or less.

22. The OLED apparatus according to claim 10, wherein the white light is emitted by mixing the red light, the green light, and the blue light, and
wherein the color coordinates (u'v') of the white light is formed at a ratio of about 30% of the red light, about 65% of the green light, and about 5% of the blue light.

* * * * *